FREQUENCY STABILIZED TUNED CIRCUIT OSCILLATOR

Filed Jan. 30, 1968

Inventor
William B. Everhart
By: Wallenstein, Spangenberg, Hattis & Strampel
Attys.

United States Patent Office 3,513,411

Patented May 19, 1970

3,513,411

FREQUENCY STABILIZED TUNED CIRCUIT OSCILLATOR

William B. Everhart, Chicago, Ill., assignor to El-Rad Manufacturing Company, Chicago, Ill., a corporation of Illinois Filed Jan. 30, 1968, Ser. No. 701,621
Int. Cl. H03b *3/04, 5/04, 5/12*
U.S. Cl. 331—109 14 Claims

ABSTRACT OF THE DISCLOSURE

A transistor Colpitts oscillator circuit is provided wherein resistive impedances are placed in the connections between the emitter and collector electrodes of the transistor and the tuned circuit of the oscillator, and a capacitor is placed in the connections between the base electrode of the transistor and the tuned circuit. The resistive impedances and the capacitor are selected to provide a near minimum collector current. This provides extremely good frequency stability, and the resistive impedance in the emitter circuit provides a negative feedback which opposes a substantial amount of positive feedback in the circuit so the oscillator operates with a gain not substantially greater than one where the oscillator is only slightly in an oscillating region.

Figure 1:
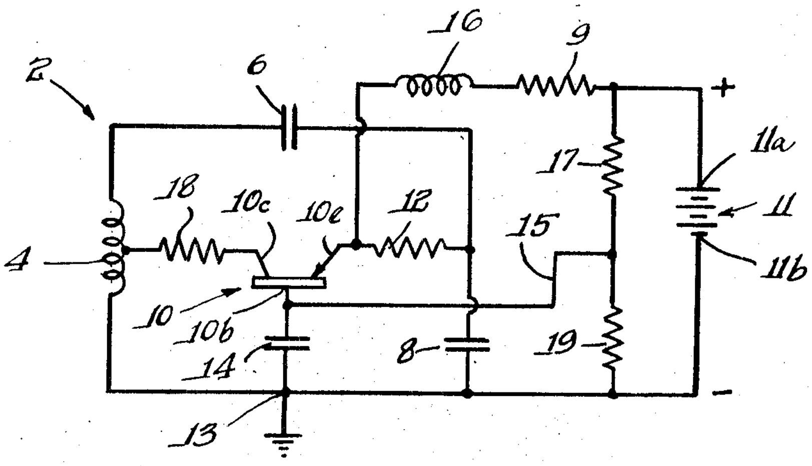
Figure 1:
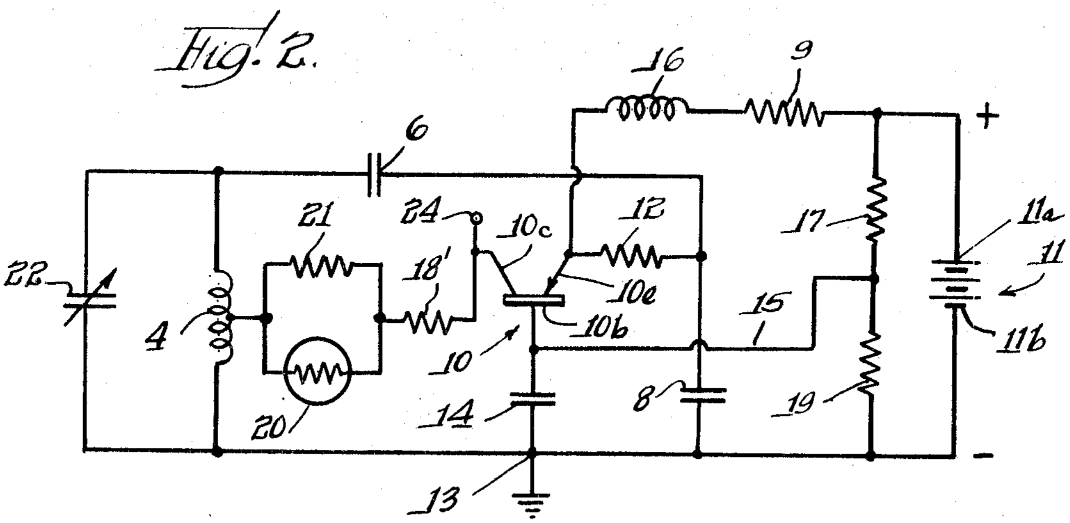

The present invention relates to transistor oscillator circuits, and has its most important utility in transistor Colpitts oscillator circuits where stability requirements are particularly stringent, such as in the case of a variable frequency oscillator circuit for master control of frequencies in single side band communication equipment.

Vacuum tube oscillator circuits generally can be designed more easily to provide good frequency stability with variation in temperature and D.C. supply voltage than transistor oscillator circuits. The present invention provides a transistor oscillator circuit with extraordinary frequency stability with variation in these variables. For examples, the features of the present invention have been incorporated in Colpitts type oscillator circuits where, with relatively large variations in the D.C. supply voltage, there was practically no frequency change. Accordingly, in one oscillator variable in frequency from 5 to 5.5 megacycles, the frequency change was held within 100 cycles (0.002%) with a twenty percent variation in the D.C. supply voltage. It is believed that such frequency stability has not even been achieved with vacuum tube oscillator circuits under the conditions involved.

In accordance with one of the aspects of the invention, a substantial amount of negative feedback is introduced into the oscillator to maximize linearity and limit the loop gain of the transistor circuit to a value not substantially greater than one where the oscillator is near the point where oscillations would cease with a modestly increased negative feedback. This, among other things, reduces the harmonic content of the output of the oscillator, which harmonic content is believed to account for some of the frequency instability heretofore encountered in transistor oscillator circuits. The negative feedback impedance is most advantageously a pure resistive impedance connected between the emitter electrode and the tuned circuit of the oscillator. To maximize the negative feedback and the value of this resistive impedance consistent with maintaining oscillation, the positive feedback of the oscillator is increased from that normally thought desirable. Thus, in the case of a Colpitts type oscillator which has a series capacitor feedback circuit with a capacitor coupled between the collector and emitter electrodes of the transistor and another capacitor coupled between the emitter and base electrodes of the transistor, unlike the usual Colpitts oscillator where the ratio of these capacitors is selected to produce just sufficient amount of positive feedback to sustain oscillation, the ratio of these capacitors is selected to produce a much greater amount of feedback than necessary to sustain oscillation in the absence of the negative feedback referred to.

To increase the frequency stability of the oscillator circuit further, it is desirable to isolate the transistor parameters as much as possible from the tuned circuit. The provision of a relatively large negative feedback producing resistive impedance aids this end. To increase this isolation, however, another substantially pure resistive impedance is preferably connected between the collector electrode and the tuned circuit. In a Colpitts type oscillator, the latter impedance is connected to the inductance of the tuned circuit preferably at a tap-off point thereon substantially removed from the opposite ends of the inductance.

In accordance with a still further aspect of the invention, a relatively small phasing capacitor is connected between the base electrode of the transistor and the tuned circuit. The values of the resistive impedances connected between the emitter and collector electrodes and the tuned circuit and the value of the capacitor connected between the base electrode of the transistor and the tuned circuit are adjusted to provide a near minimum emitter to collector current. The addition of the capacitor and its proper adjustment is believed to be the most important frequency stabilizing factor in the circuit described. The capacitor adjusts the relative phase of the emitter to base current and the emitter to collector current.

The above and other advantages and features of the invention will become apparent upon making reference to the specification to follow, the claims and the drawings wherein:

FIG. 1 is a basic circuit diagram of a Colpitts type oscillator to which the features of the present invention have been applied; and FIG. 2 is a complete circuit diagram of the most preferred form of Colpitts type oscillator incorporating the features of the present invention.

Referring now more particularly to FIG. 1, the Colpitts type oscillator there shown and identified by reference numeral 2 includes a tuned circuit comprising an inductance 4 and capacitors 6 and 8 connected in series between the opposite ends of the inductance 4. The tuned circuit is coupled to the electrodes of a PNP transistor 10. In a Colpitts oscillator, the series connected capacitors 6 and 8 provide a positive feedback circuit where the capacitors are effectively connected in series between the collector and base electrodes 10*c* and 10*b* of the transistor 10, and the emitter electrode 10*e* is coupled to the juncture of the capacitors 6 and 8. A source of energizing or supply voltage 11 may be connected to the transistor as indicated in FIG. 1. As there shown, the positive terminal 11*a* of the D.C. supply source 11 is coupled through a current-limiting resistor 9 and an isolating choke 16 to the emitter electrode 10*e* of the transistor 10. The negative terminal 11*b* of the D.C. supply is connected to a reference point or ground 13 to which one end of the inductance 4 is also connected. The base electrode 10*b* is also coupled to the reference point or ground 13. The proper operating point of the transistor 10 is selected preferably by connecting the base electrode 10*b* by a conductor 15 to a voltage divider network comprising resistors 17 and 19 connected in parallel with the D.C. voltage supply source 11.

As previously indicated, the ratio of capacitors 6 and 8 in Colpitts oscillators is generally selected to produce just a sufficient amount of feedback to sustain oscillation. The ratio of the capacitance of capacitors 6 and 8 is commonly selected in the range of from 5 to 100. However, in the preferred form of the invention, as will appear, the preferred ratios of these capacitances will generally fall far below this range, so that much more than normal positive feedback is utilized.

As previously indicated, the present invention modifies the conventional oscillator by inserting in the connections between one or more of the transistor electrodes and the tuned circuit one or more impedances which increase the frequency stability of the oscillator circuit with variation in temperature and the value of the supply voltage source 11. These impedances connected between the electrodes of the transistor 10 and the tuned circuit are selected in such a way as to provide isolation of the tuned circuit from the transistor 10, whose parameters may vary with temperature and the value of the supply voltage source 11, so that minimum loading of the tuned circuit is achieved. Also, it is most advantageous to operate the transistor 10 under linear conditions. By isolating the transistor 10 from the tuned circuit as much as possible, operating the transistor 10 at maximum linearity and limiting the gain of the transistor 10 close to one, the harmonic content in the oscillator output is reduced and the frequency stability thereof is maximized.

In accordance with one aspect of the present invention, a negative feedback producing resistive impedance 12, most advantageously a pure resistive impedance, is connected between the emitter electrode **10*a* and the tuned circuit. Where a Colpitts oscillator is involved, the connection of the resistive impedance 12 to the tuned circuit is made at the juncture between the capacitor 6 and 8. Negative feedback increases the linearity of opperation of the transistor, so, to maximize the negative feedback, in contrast to the usual Colpitts oscillator design practice, as above indicated, the ratio of the capacitors 6 and 8 is made much greater than necessary to produce just sufficient amount of positive feedback to sustain oscillation in the absence of the negative feedback producing resistive impedance 12. For example, in one exemplary form of the invention, the ratio of the capacitance of capacitors 6 and 8 was selected to be about ½ (.55). In order to minimize the loading effect of the transistor 10 on the tuned circuit, the impedances in the circuit should be selected so that the emitter to base current is near a minimum value. To best adjust this current to a near minimum value, it was found extremely advantageous to place a capacitor 14 between the base electrode 10*b* of the transistor 10 and the tuned circuit, namely between the base electrode 10*b* and ground 13 in the circuit illustrated in the drawings. The capacitor 14 is preferably a small capacitor so it doesn't function as a bypass capacitor. In the oscillators of the invention heretofore constructed, it was found that the capacitor functions most satisfactory when the capacitance thereof is in the range of from ⅕ the value of the capacitor 6 and ¹⁄₁₀ the value of capacitor 8 when the ratio of capacitors 6 and 8 is as above indicated. It is significant to note that, due to the relatively larger amount of negative feedback effected by the resistive impedance 12 connected between the emitter electrode 10*e* and the juncture of the capacitors 6 and 8, the base electrode impedance is very high. This permits the value of the capacitance of capacitor 14 to be very small. Also, since the capacitor 14** is connected in common with both the emitter to base circuit and the collector to base circuit of the transistor, its adjustment will affect the phase of the currents flowing in both of these circuits.

Perhaps the most important aspect of the invention is the discovery that, by initially experimentally varying the values of the resistive impedances 12 and the capacitor 14, a point is reached where the frequency output of the oscillator suddenly becomes locked-in or synchronized to a given value consequently any wide variation in the value of the supply voltage source 11 will cause little or no change in the output of the frenquency of the oscillator.

In the most advantageous form of the invention, a substantially pure resistive impedance 18 is connected between the collector electrode **10*c* of the transistor 10 and preferably a tap-off point on the inductance 4 substantially spaced from the ends thereof, such as a center tap point thereon. The resistive impedance 18 further isolates the transistor 10 from the tuned circuit and it reduces the harmonic content of the signal produced by the oscillator circuit and, in so doing, increases frequency stability. Also, the value of the resistive impedance 18 determines the criticality of the adjustment of capacitor 14 and the negative feedback resistive impedance 12. Thus, if the value of the resistive impedance 18 is too large, little or no variation in emitter to base current will take place with the variation of the resistive impedances 12 and the capacitor 14. When the resistive impedances 12 and 18 and capacitive impedance 14** are adjusted to their most advantageous values, the emitter to base current is near a minimum value and a small variation in any of these impedances will produce a steep change in current.

An exemplary method for selecting the best values of the resistive impedances 12 and 18 and the capacitor 14 is as follows: First, in the initial breadboard model of the oscillator, the resistive impedances 12 and 18 and the capacitor 14 are initially selected to be variable impedances. The resistive impedances 12 and 18 are first adjusted to a minimum value and the capacitor 14 is reduced from a maximum value toward a minimum value until oscillation stops. The value of the capacitor 14 is doubled for a preliminary setting. Next, the resistive impedance 12 is increased until oscillation stops. This value of the resistive impedance 12 is then halved for its preliminary setting. Next, the resistive impedance 18 is increased while observing the amount of emitter current flowing through the resistor 9 in the portion of the circuit connecting the positive terminal **11*a* of the D.C. supply source 11 to the emitter electrode 10*a*. This current will gradually decrease until a definite current minimum point is reached. If the region of minimum current is not a sharp or prominent current dip, the values of the resistive impedance 12 and the capacitor 14 should be adjusted slightly until a sharp current dip point is obtained. This optimum frequency stability will be closely approximated when the adjustment of the resistive impedances 12 and the capacitor 14 yields a current dip of maximum sharpness. The value of the resistive impedance 18** is then for its preliminary setting left at a value where the prominent current dip is present.

Final adjustments of the circuit impedances are made under observation of actual frequency change of the oscillator with variation of the output of the D.C. supply source 11. The resistive impedance 12 and the capacitor 14 are alternatively readjusted slightly until a point is reached where the adjustment results in a minimum frequency change. The resistive impedance 18 is finally adjusted until the least frequency change is effected by varying the output of the D.C. voltage supply source 11. The circuit is now said to be adjusted to optimum stability and the values of the variable impedances are then replaced by fixed value impedances preferably with a tolerance from about 5 to 10%.

In the course of the varying of value of the resistive impedance 18 connected between the collector electrode **10*c* and the tuned circuit 4, it was discovered that the frequency of the oscillator would increase somewhat as the value of the resistive impedance 18 was decreased. This affect on the frequency of the oscillator indicated that an increase in frequency stability with variation in the temperature of transistor 10 can be achieved by placing a thermistor 20 between the collector electrode 10*c* and the tuned circuit, as illustrated in FIG. 2, to which reference should now be made for the disclosure of the most preferred circuit of the invention. As there shown, the resistive impedance 18 in FIG. 1 is replaced by a resistor 18' connected in series with the thermistor 20. If the resistance-temperature characteristics of the thermistor 20 is different from that desired, a suitable resistor 21 may be connected in parallel with the thermistor 20**, as indicated.

When power to transistor 10 is turned on, it will gradually heat up due to current flow therethrough which will tend to cause a negative frequency change in the absence of thermistor 20. (This initial change, although of short duration, can be undesirable in, for example, a variable frequency oscillator of a radio receiver.) This tendency of frequency drift is opposed by the internal heating of the thermistor 20 which will tend to cause a positive frequency charge. The proper selection of the value of thermistor 20 and resistor 21 will produce a proper amount of compensation to prevent frequency drift when the oscillator is initially turned-on and also under variations in ambient temperature.

The exemplary figure parameters for one of the circuits constructed in accordance with the circuit diagram of FIG. 2 are as follows:

Resistor 12—100 ohms
Resistor 18—270 ohms
Resistor 21—330 ohms
Resistor 17—12,000 ohms
Resistor 19—12,000 ohms
Resistor 9—680 ohms
Thermistor 20—200 ohms at 25° C. (—480 ohms resistance change from 0 to 50° centigrade)
Capacitor 6—190 picofarads
Capacitor 8—400 picofarads
Capacitor 14—36 picofarads
Transistor 10—MPS 6518 silicon transistor
Inductance 4—5 microhenries When the oscillator is a variable frequency oscillator, a variable capacitor 22 may be connected in parallel with the inductance 4, as illustrated in FIG. 2. The output from the oscillator may be taken from a number of points, as, for example, at an output terminal 24 connected to the collector electrode 10c of the transistor 10.

The oscillator illustrated in FIG. 2 disclosed in detail above is not suitable for delivering a larger amount of power, and thus the output terminal 24 will, under normal circumstances, be connected to buffer and power amplifiers (not shown).

As previously indicated, by utilizing the features of the present invention described above, an oscillator can be made to provide unusual frequency stability with a large variation in ambient temperature and the output of the D.C. voltage supply source 11.

It should be understood that numerous modifications may be made in the most preferred form of the invention described above without deviating from the broader aspects therein.

I claim:

1. An oscillator circuit comprising: a source of D.C. energizing voltage; a transistor having emitter, collector and base electrodes; and a tuned circuit comprising an inductance and at least two series connected positive feedback producing capacitors connected between the collector and base electrodes of the transistor, said emitter electrode being coupled to the juncture of said series connected capacitors to form a Colpitts type oscillator circuit; said source of energizing voltage being connected in series with emitter and collector electrodes to form an energized oscillator circuit; and a direct current passing circuit between the collector electrode and said inductance of said tuned circuit which direct current passing circuit includes frequency stabilizing means comprising a substantially resistive impedance means which substantially reduces the effect of variations in the parameters of the transistor on the tuned circuit.

2. The oscillator circuit of claim 1 wherein the variation of the resistance value of said substantially resistive impedance means varies the frequency of the oscillator and includes a temperature responsive portion which counteracts any change of frequency of the oscillator due to the variation in the temperature of the transistor.

3. The oscillator of claim 1 wherein said substantially resistive impedance means is connected to the inductance at a point substantially removed from the opposite ends of the inductance.

4. An oscillator circuit comprising a source of D.C. energizing voltage; a transistor having emitter, collector and base electrodes; a tuned circuit including inductance and capacitance forming portions with three connecting points respectively coupled to said emitter, collector and base electrodes, and a positive feedback oscillation producing portion which produces oscillation when the circuit is energized; means connecting said source of energizing voltage to said emitter and collector electrodes of said transistor for energizing the oscillator circuit; and impedance means bteween the emitter electrode of said transistor and said tuned circuit for providing a negative feedback voltage on the base elecerode of the transistor to operate the transistor circuit linearly and with a loop gain not substantially greater than one so the oscillator is near the point where oscillations will cease if the negative feedback were increased, the loop gain due to said positive feedback oscillation producing portion being made much greater than one so that said negative feedback reduces the total loop gain to a value not substantially greater than one.

5. An oscillator of claim 4 wherein the impedance between the emitter electrode and said tuned circuit is a substantially resistive unbypassed impedance.

6. The oscillator circuit of claim 5 wherein said tuned circuit comprises an inductance and at least a pair of series connected positive feedback producing capacitors connected with the electrodes of the transistor to form a Colpitts type oscillator, and said substantially resistive impedance between the emitter electrode and the tuned circuit being connected to the juncture of said series connected capacitors.

7. The oscillator circuit of claim 4 wherein there is provided a capacitive impedance connected between the base electrode of the transistor and said tuned circuit, said capacitive impedance in conjunction with said impedance means connected between the emitter electrode of the transistor and the tuned circuit providing a near minimum emitter to collector current to minimize the load of the transistor on the tuned circuit.

8. The oscillator circuit of claim 7 wherein there is provided a substantially resistive impedance means connected between the collector electrode of the transistor and said tuned circuit, the latter resistive impedance having a value providing a steep dip in the emitter to collector current characteristic with variation in the first mentioned impedance means and capacitive impedance.

9. The oscillator circuit of claim 7 wherein there is provided a substantially resistive impedance means connected between the collector electrode of the transistor and said tuned circuit, the latter resistive impedance means having a value providing near minimum emitter to collector current.

10. The oscillator circuit of claim 4 wherein said tuned circuit comprises an inductance and a pair of positive feedback capacitors connected in series between the collector and base electrodes of the transistor, the emitter electrode of said transistor being coupled through said impedance means to the juncture of said capacitors to forms a Colpitts type oscillator circuit, and there is provided a substantially resistive isolating impedance connected between said collector electrode and said inductance.

11. The oscillator circuit of claim 10 wherein the isolating impedance is connected to said inductance at a tap-off point substantially removed from the opposite ends thereof.

12. The oscillator of claim 4 wherein said source of D.C. energizing voltage has one terminal connected to said emitter electrode of the transistor at a point which bypasses said impedance means connected between the emitter electrode and said tuned circuit, and another terminal connected to a reference point to which said collector and base electrodes of said transistor and said tuned circuit are coupled.

13. In an oscillator circuit including a source of D.C. energizing voltage; a transistor having emitter, collector and base electrodes; and a tuned circuit including inductance and capacitance forming portions with three connecting points respectively coupled to said emitter, collector and base electrodes, and a positive feedback oscillation producing portion which produces oscillation when the circuit is energized; and means connecting said source of energizing voltage to said emitter and collector electrodes of said transistor for energizing the oscillator circuit; the improvement comprising: first and second impedance means between the emitter and collector electrodes of said transistor and said tuned circuit, third impedance means in the connections between the base electrode and said tuned circuit, all of said impedance means being of a value which provides a near minimum current flow between the emitter and collector electrodes of the transistor, to minimize the loading of the transistor on the tuned circuit.

14. The oscillator circuit of claim 13 wherein said first and second impedance means are substantially resistive impedances and said third impedance is a substantially capacitive impedance.

References Cited

UNITED STATES PATENTS

| | | | |
|---|---|---|---|
| 2,836,724 | 5/1958 | Kaminow | 331—117 |
| 2,930,002 | 3/1960 | Edwards et al. | 331—117 X |
| 3,150,328 | 9/1964 | Schrecongost | 331—117 X |

ROY LAKE, Primary Examiner

S. H. GRIMM, Assistant Examiner

U.S. Cl. X.R.

331—117, 175, 176